(12) United States Patent
Green-Petersen et al.

(10) Patent No.: US 12,538,802 B2
(45) Date of Patent: Jan. 27, 2026

(54) DEVICE FOR DETERMINING EXISTENCE OF DAMAGE IN SEMICONDUCTOR DEVICE AND METHOD RELATED THERETO

(71) Applicant: Mellanox Technologies Ltd., Yokneam (IL)

(72) Inventors: Allan Green-Petersen, Yokneam (IL); Kasper Andersen, Yokneam (IL); Henrik Ahrendt, Yokneam (IL); Thomas Roager, Yokneam (IL)

(73) Assignee: Mellanox Technologies Ltd., Yokenam (IL)

( * ) Notice: Subject to any disclaimer, the term of this patent is extended or adjusted under 35 U.S.C. 154(b) by 634 days.

(21) Appl. No.: 17/742,784

(22) Filed: May 12, 2022

(65) Prior Publication Data

US 2023/0369244 A1    Nov. 16, 2023

(51) Int. Cl.
*H01L 23/00* (2006.01)
*G01R 31/26* (2020.01)
*H01L 23/58* (2006.01)

(52) U.S. Cl.
CPC ........ *H01L 23/562* (2013.01); *G01R 31/2601* (2013.01); *H01L 23/564* (2013.01); *H01L 23/585* (2013.01)

(58) Field of Classification Search
None
See application file for complete search history.

(56) References Cited

U.S. PATENT DOCUMENTS

2018/0145002 A1* 5/2018 Munder ................. H01L 23/66
2019/0250208 A1* 8/2019 Dhanasekaran ... G01R 31/2856

* cited by examiner

*Primary Examiner* — Sue A Purvis
*Assistant Examiner* — Jordan M Klein
(74) *Attorney, Agent, or Firm* — PEARL COHEN ZEDEK LATZER BARATZ LLP

(57) ABSTRACT

A semiconductor device may include a semiconductor substrate, a wire placed along at least a portion of a perimeter of the semiconductor substrate, and processing circuitry connected to the wire, the processing circuitry to, based on a signal from the wire, determine whether or not the semiconductor device is damaged.

17 Claims, 7 Drawing Sheets

DEVICE FOR DETERMINING EXISTENCE OF DAMAGE IN SEMICONDUCTOR DEVICE AND METHOD RELATED THERETO

FIELD OF THE INVENTION

The present invention relates to the field of semiconductor devices, and more particularly, to device and method for determining existence of damage in semiconductor substrates.

BACKGROUND OF THE INVENTION

Bare semiconductor devices such as bare chips may be damaged during, e.g., an assembly process or at another time. Failure analysis of damaged devices is typically long process that includes software- and firmware-based solutions as well as physical analysis of damaged devices.

SUMMARY OF THE INVENTION

Some embodiments of the present invention may provide a semiconductor device including: a semiconductor substrate; a wire placed along at least a portion of a perimeter of the semiconductor substrate; and processing circuitry connected to the wire, the processing circuitry to, based on a signal from the wire, determine whether or not the semiconductor device is damaged.

In some embodiments, the semiconductor device may include a seal ring placed along the perimeter of the semiconductor substrate, wherein wire is placed near the seal ring such that the seal ring surrounds the wire.

In some embodiments, the semiconductor device may include a plurality of wires each placed along a portion of the perimeter of the semiconductor substrate.

In some embodiments, the processing circuitry to, based on signals from the plurality of wires, determine a location at which the semiconductor substrate is damaged.

In some embodiments, the semiconductor substrate may include a plurality of layers and the semiconductor device may include a plurality of wires each placed in one or more of the plurality of layers of the semiconductor substrate.

In some embodiments, the processing circuitry to, based on signals from the plurality of wires, determine a location at which the semiconductor substrate is damaged.

In some embodiments, the signal is digital.

In some embodiments, the signal is analog.

In some embodiments, the wire is placed on a top flat surface of the semiconductor substrate.

In some embodiments, the wire is placed within the semiconductor substrate.

Some embodiments of the present invention may provide a device including: a support structure including an integrated circuit; a wire placed around the support structure; and a controller receiving a signal from the wire and based on the signal, to determine if the support structure is damaged.

In some embodiments, the device may include a seal ring placed along the perimeter of the support structure, wherein wire is placed near the seal ring such that the seal ring surrounds the wire.

In some embodiments, the device may include a plurality of wires each placed along a portion of the perimeter of the support structure.

In some embodiments, the controller to, based on signals from the plurality of wires, determine a location at which the support structure is damaged.

In some embodiments, the support structure may include a plurality of layers and wherein the device may include a plurality of wires each placed in one or more of the plurality of layers of the support structure.

In some embodiments, the controller to, based on signals from the plurality of wires, determine a location at which the support structure is damaged.

In some embodiments, the signal is digital.

In some embodiments, the signal is analog.

In some embodiments, the wire is placed on a top flat surface of the support structure.

In some embodiments, the wire is placed within the support structure.

Some embodiments of the present invention may determine existence of damage in a semiconductor substrate by: receiving a signal from a wire placed along at least a portion of a perimeter of the semiconductor substrate; and based on the signal, determining whether or not the semiconductor substrate is damaged.

In some embodiments, the semiconductor substrate may include a plurality of wires each placed along a portion of the perimeter of the semiconductor substrate, and based on signals from the plurality of wires, a location at which the semiconductor substrate is damaged may be determined.

In some embodiments, the semiconductor substrate may include a plurality of layers and a plurality of wires each placed in one or more of the plurality of layers of the semiconductor substrate, and based on signals from the plurality of wires, a location at which the semiconductor substrate is damaged may be determined.

BRIEF DESCRIPTION OF THE DRAWINGS

For a better understanding of embodiments of the invention and to show how the same can be carried into effect, reference will now be made, purely by way of example, to the accompanying drawings in which like numerals designate corresponding elements or sections throughout.

In the accompanying drawings.

Figure 1A:
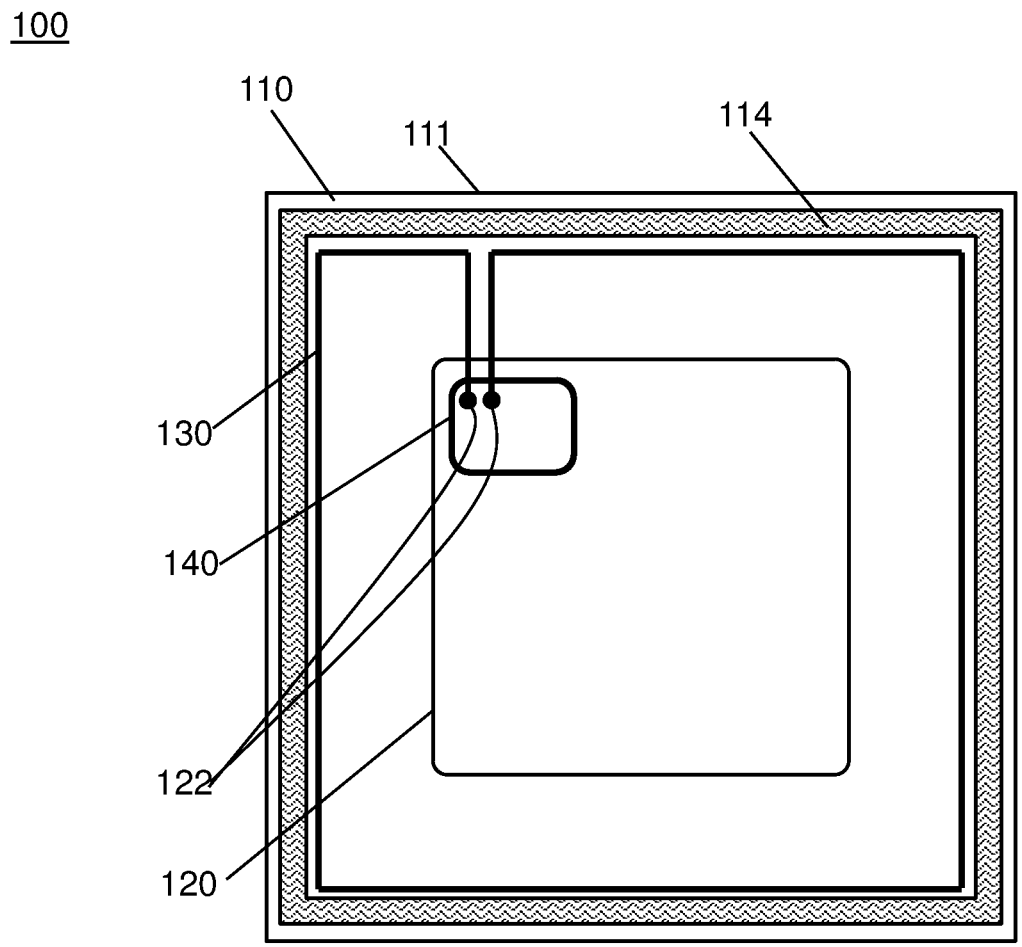
FIG. 1A is a schematic illustration of a device for determining existence of damage in a substrate or support structure of the device, according to some embodiments of the invention.

It will be appreciated that, for simplicity and clarity of illustration, elements shown in the figures have not necessarily been drawn to scale. For example, the dimensions of

DETAILED DESCRIPTION OF THE INVENTION

In the following description, various aspects of the present invention are described. For purposes of explanation, specific configurations and details are set forth in order to provide a thorough understanding of the present invention. However, it will also be apparent to one skilled in the art that the present invention can be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention can be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that can be practiced or carried out in various ways as well as to combinations of the disclosed embodiments. Also, it is to be understood that the phraseology and terminology employed herein is for the purpose of description and should not be regarded as limiting.

Reference is now made to FIG. 1A, which is a schematic illustration of a device 100 for determining existence of damage in a substrate or support structure of device 100, according to some embodiments of the invention. FIG. 1A shows a schematic top view of device 100.

Figure 1B:
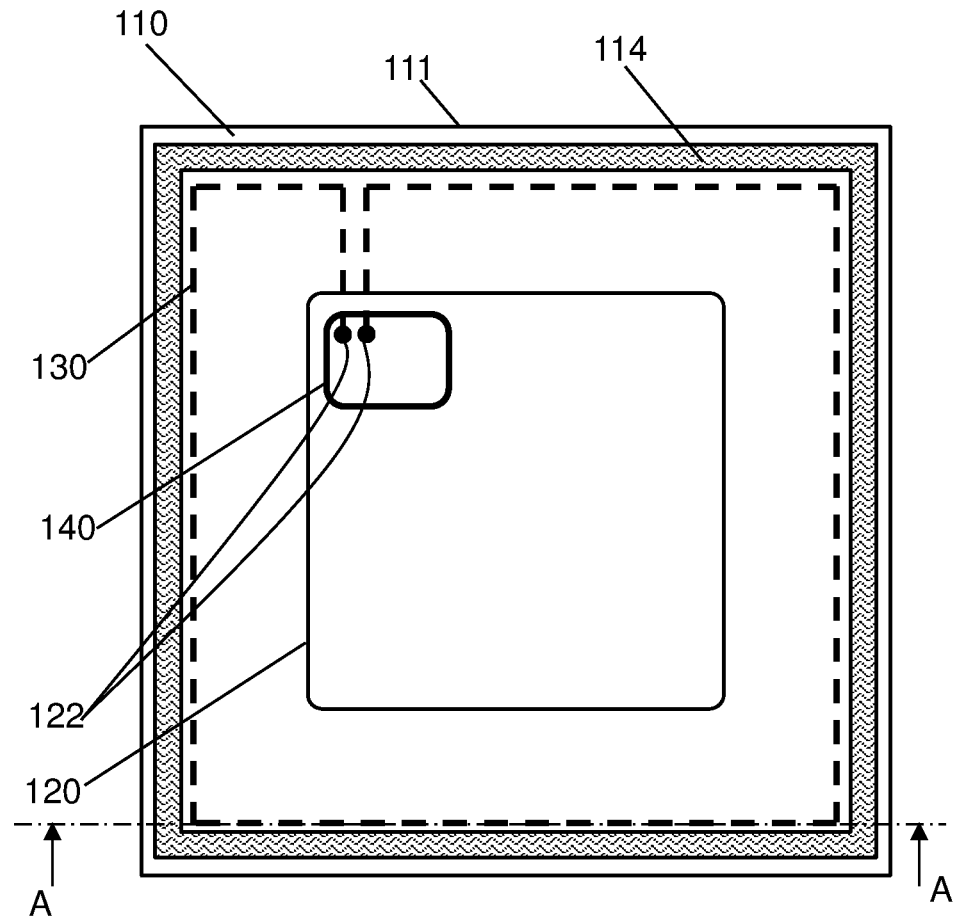
FIGS. 1B and 1C are schematic illustrations of the device including a wire placed within a support structure of the device, according to some embodiments of the invention.
Figure 1C:
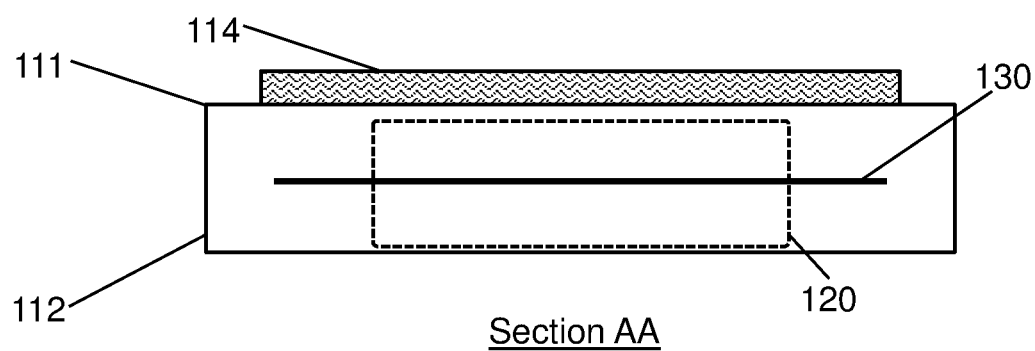

Reference is also made to FIGS. 1B and 1C, which are schematic illustrations of device 100 including a wire 130 placed within a support structure 110 of device 100, according to some embodiments of the invention. FIG. 1B shows a schematic top view of device 100. FIG. 1C shows a schematic section view of device 100 along line AA of FIG. 1B.

Figure 1D:
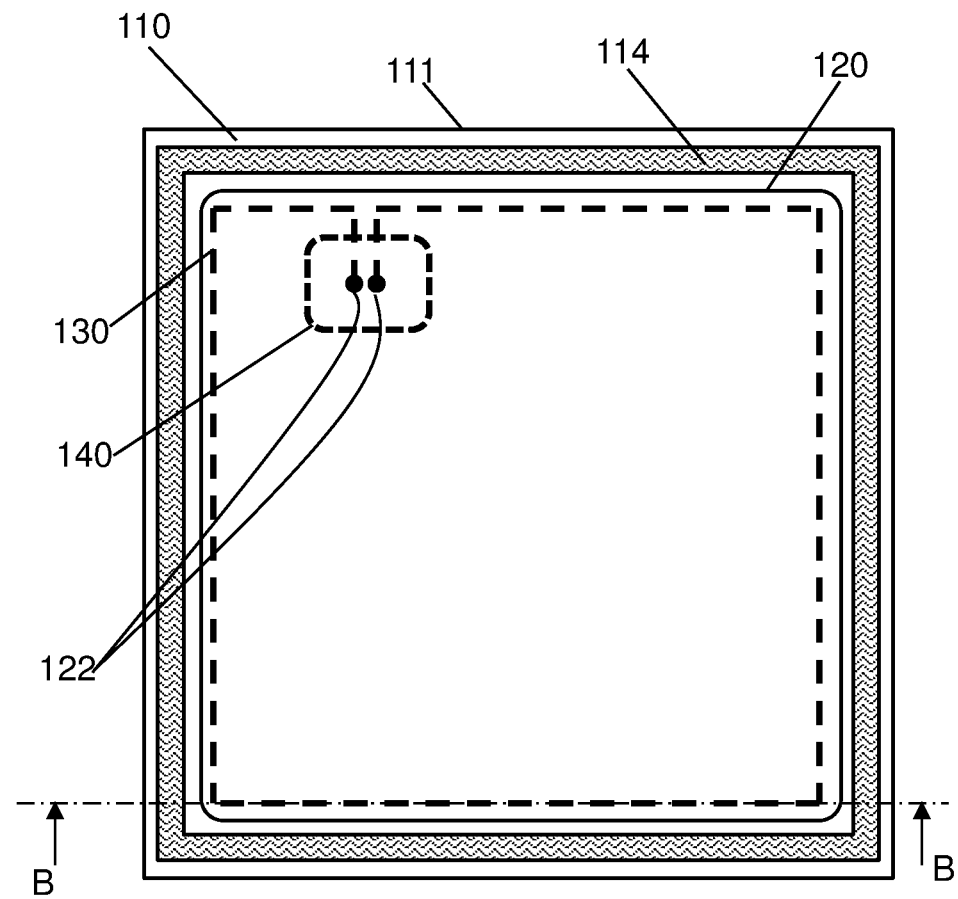
FIGS. 1D and 1E are schematic illustrations of the device including the wire placed within an integrated circuit of the device, according to some embodiments of the invention.
Figure 1E:
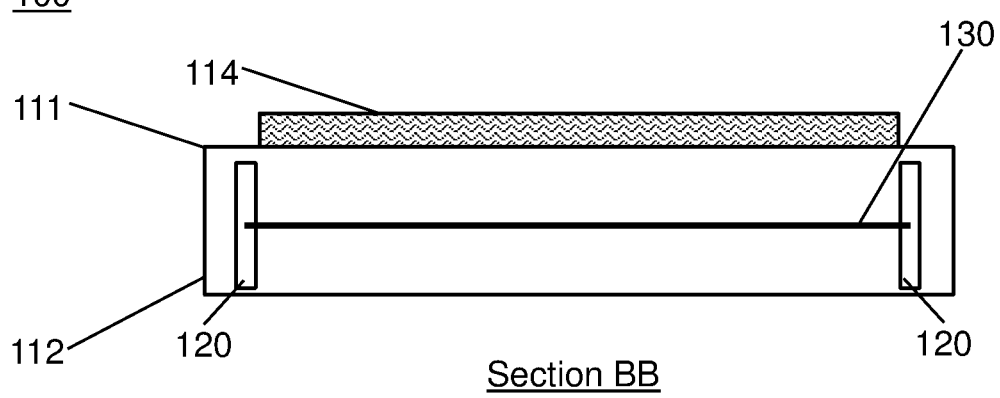

Reference is also made to FIGS. 1D and 1E, which are schematic illustrations of device 100 including wire 130 placed within an integrated circuit 120 of device 100, according to some embodiments of the invention. FIG. 1D shows a schematic top view of device 100. FIG. 1E shows a schematic section view of device 100 along line BB of FIG. 1D.

Figure 1F:
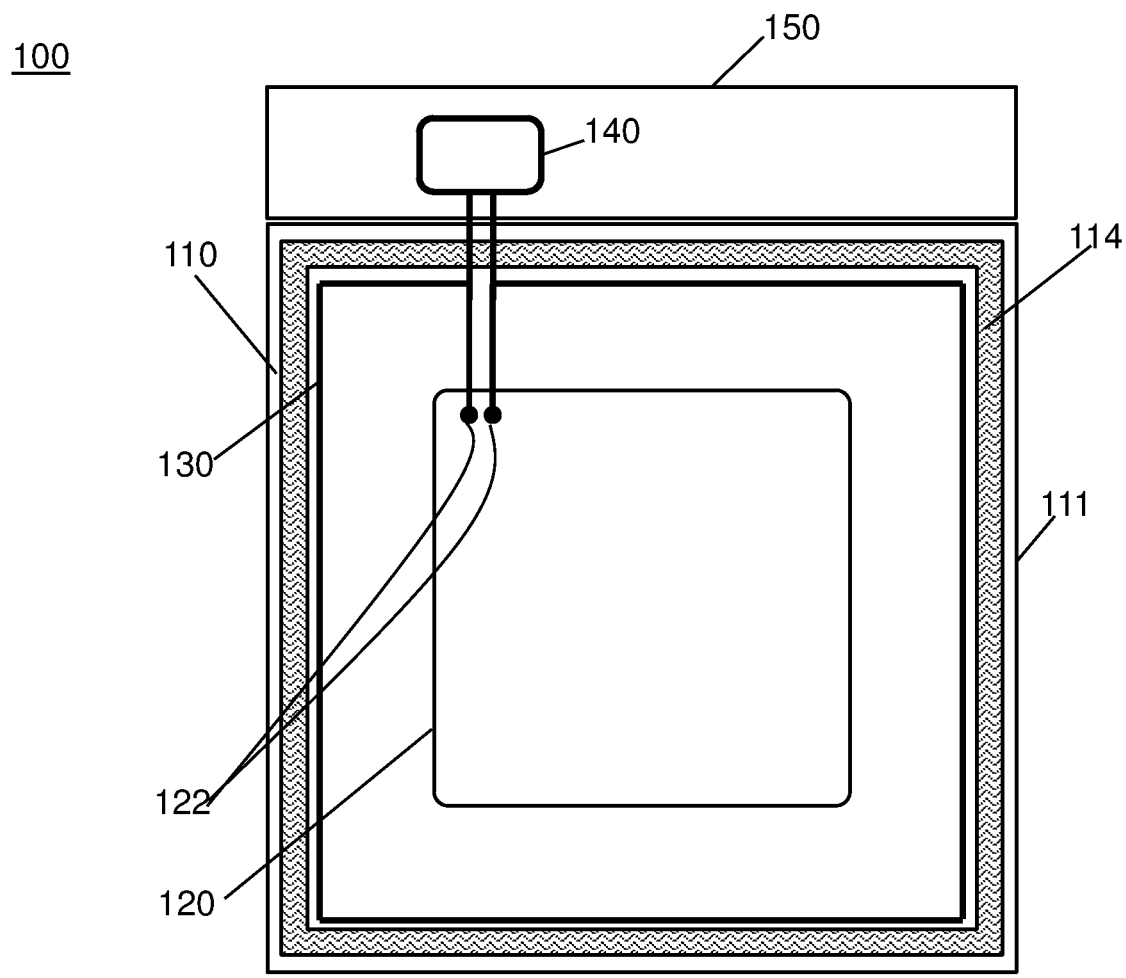
FIG. 1F is a schematic illustration of the device including processing circuitry positioned external to the integrated circuit of the device, according to some embodiments of the invention.

Reference is also made to FIG. 1F, which is a schematic illustration of device 100 including processing circuitry 140 positioned external to integrated circuit 120 of device 100, according to some embodiments of the invention.

Device 100, such as semiconductor device, may include a substrate or support structure 110. Support structure 110 may be made of or may include a semiconductor material such as, e.g., silicon. Support structure 110 may be a substrate including an integrated circuit 120.

Device 100 may include a wire (e.g., a metal wire) 130. Wire 130 may be connected to, e.g. input/output 122 of integrated circuit 120. In some embodiments, wire 130 may be placed on a top flat surface of support structure 110 (e.g., as shown in FIG. 1A). Wire 130 may be placed along at least a portion of an outer edge or a perimeter 111 of support structure 110. Wire 130 may surround integrated circuit 120 and may be placed in a region between integrated circuit 120 and outer edge or perimeter 111 of support structure 110. For example, device 100 may include a seal ring 114 placed along outer edge or perimeter 111 of support structure 110 and surrounding integrated circuit 120 (e.g., as shown in FIG. 1A). In this example, wire 130 may be placed in a region between integrated circuit 120 and seal ring 114 (e.g., adjacent to seal ring 114) such that seal ring 114 surrounds wire 130 (e.g., as shown in FIG. 1A). Wire 130 may be placed adjacent to seal ring 114, for example at a distance of 1-100 micrometer from seal ring 114. The distance of wire 130 from seal ring 114 may be dictated by, for example, design constraints or considerations of device 100 and/or by respective manufacturing process constraints or considerations of device 100. In some embodiments, the distance of wire 130 from seal ring 114 may be set to be close to a minimal distance allowed according to the design constraints of device 100, e.g. the wire 130 is placed as near as possible to the seal ring 114.

In some embodiments, wire 130 may be placed within support structure 110. For example, wire 130 may be placed within support structure 110, e.g., in a region between integrated circuit 120 and outer surfaces 112 of support structure 110, e.g., as schematically shown in FIGS. 1B-1C.

In some embodiments, wire 130 may be placed within integrated circuit 120. For example, wire 130 may be placed within integrated circuit 120, e.g., along outer surfaces 112 of support structure 110, e.g., as schematically shown in FIGS. 1B-1C.

Device 100 may include one or more wires (e.g., such as wire 130) placed in different portions of support structure 110 than shown or described.

Device 100 may include processing circuitry (e.g., a controller) 140. In some embodiments, processing circuitry 140 may be part of integrated circuit 120 (e.g., as schematically shown in FIGS. 1A-1E). In some embodiments, processing circuitry 140 may be positioned external to integrated circuit 120. For example, processing circuitry 140 may be positioned on a support structure 150, wherein support structure 150 is external to and is not part of support structure (e.g. semiconductor substrate) 110, e.g., as schematically shown in FIG. 1F. In some embodiments, processing circuitry 140 may be included in or may be connected to an input/output (IO) pad or circuitry positioned between integrated circuit 120 and seal ring 114. Processing circuitry 140 may be connected to wire 130. Processing circuitry 140 may determine, based on a signal from wire 130, whether or not support structure 110 is damaged. Processing circuitry 140 may be analog, digital or a combination thereof.

For example, during an assembly process, or at another time, support structure 110 of device 100 may be damaged, e.g., broken. Such damage typically occurs along outer edge or perimeter 111 of support structure 110. Damage of support structure 110 may cause damage of wire 130 placed along outer edge or perimeter 111 of support structure 110. Based on the signal from wire 130, processing circuitry 140 may determine whether or not wire 130 and thus support structure 110 are damaged. For example, if no signal is received from wire 130 or if the signal from wire 130 is different from the input signal provided to wire 130, it may be determined that wire 130 and thus supporting structure 110 are damaged. The signal may be digital or analog.

Figure 2:
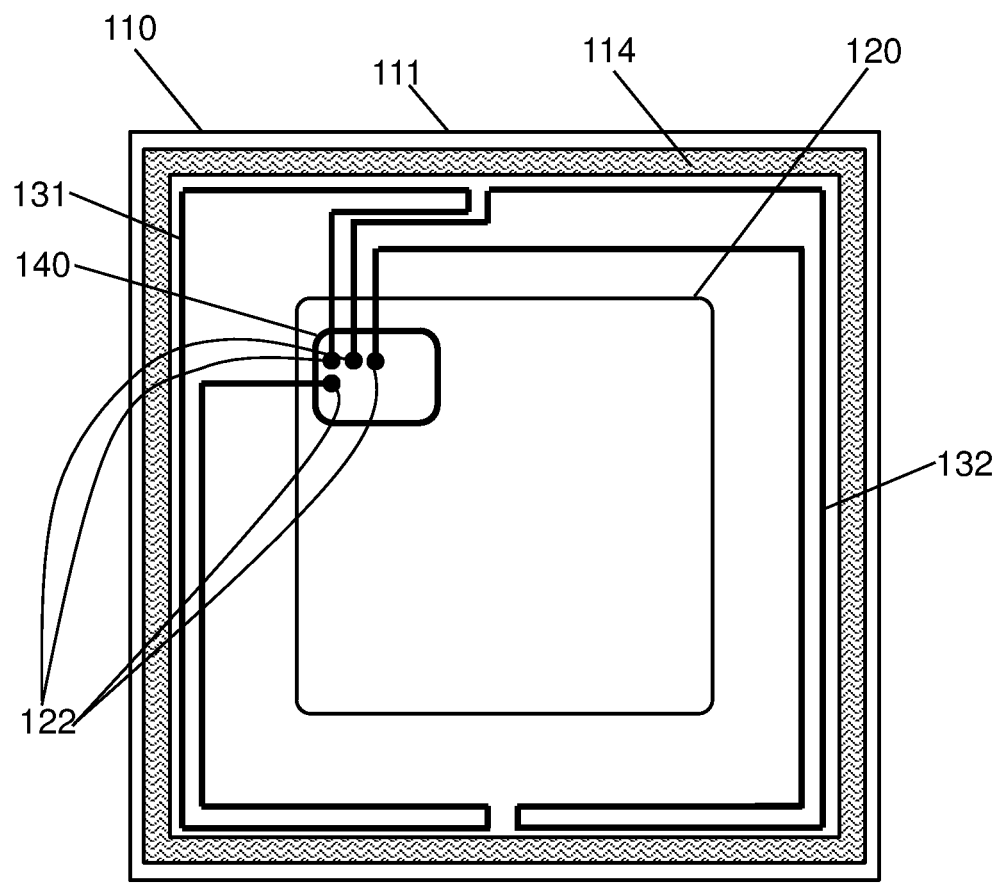
FIG. 2 is a schematic illustration of the device including wires placed at different positions along a perimeter of the support structure of the device, according to some embodiments of the invention.

Reference is now made to FIG. 2, which is a schematic illustration of device 100 including wires 131, 132 placed at different positions along perimeter 111 of support structure 110 of device 100, according to some embodiments of the invention. FIG. 2 shows a schematic top view of device 100.

Device 100 may include two or more wires, for example a wire 131 and a wire 132. Each of wires 131, 132 may be placed on the top flat surface of support structure 110 in the region between integrated circuit 120 and outer edge or perimeter 111 or seal ring 114 along a different portion of outer edge or perimeter 111 of support structure 110 of device 100. Each of wires 131, 132 may be connected to processing circuitry 140. Processing circuitry 140 may determine, based on signals from wires 131, 132, a location at which support structure 110 is damaged (e.g., as described above with respect to FIGS. 1A-1F). For example, if no signal from wire 131 is received, it may be determined that wire 131 and a portion of support structure 110 along wire 131 are damaged.

While two wires 131, 132 are shown, device 100 may include a plurality of wires each placed along a different portion of outer edge or perimeter 111 of support structure 110.

Figure 3A:
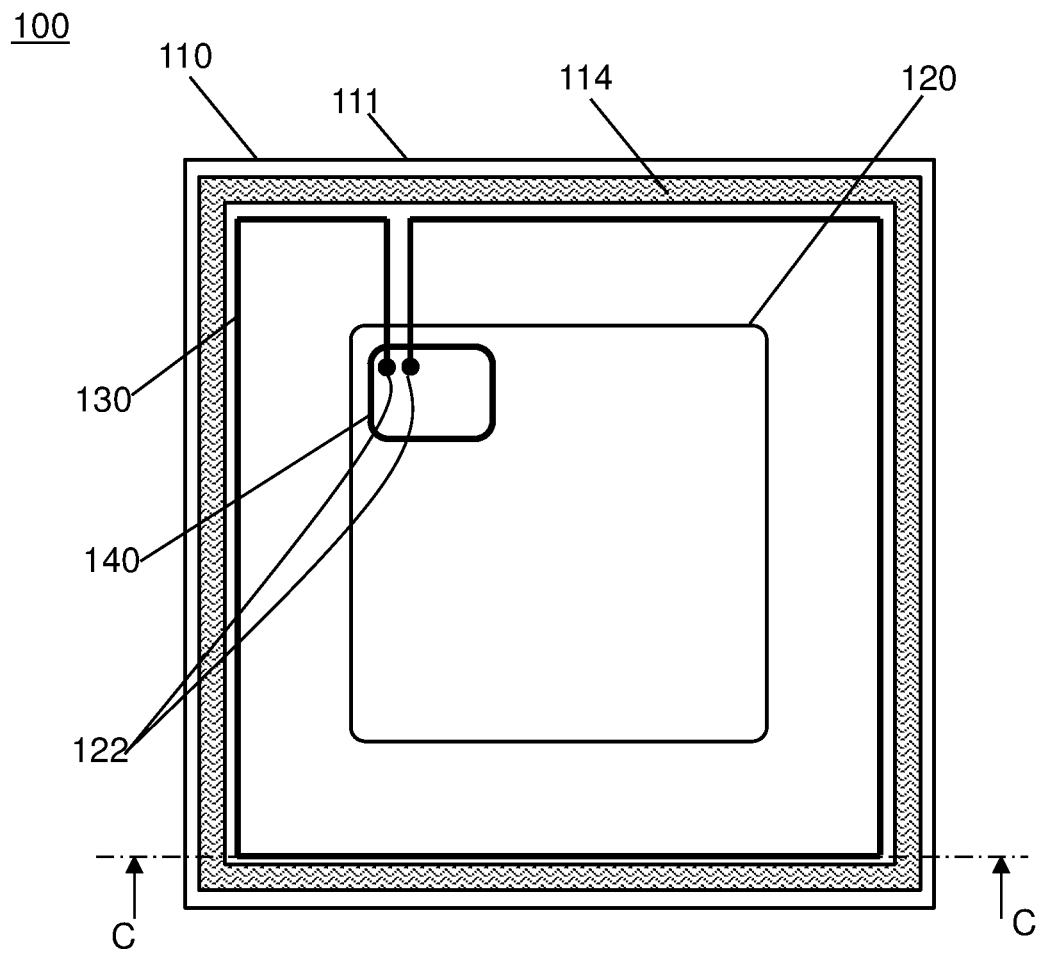
FIGS. 3A and 3B are schematic illustrations of the device including wires placed in different layers of the support structure of the device, according to some embodiments of the invention.
Figure 3B:
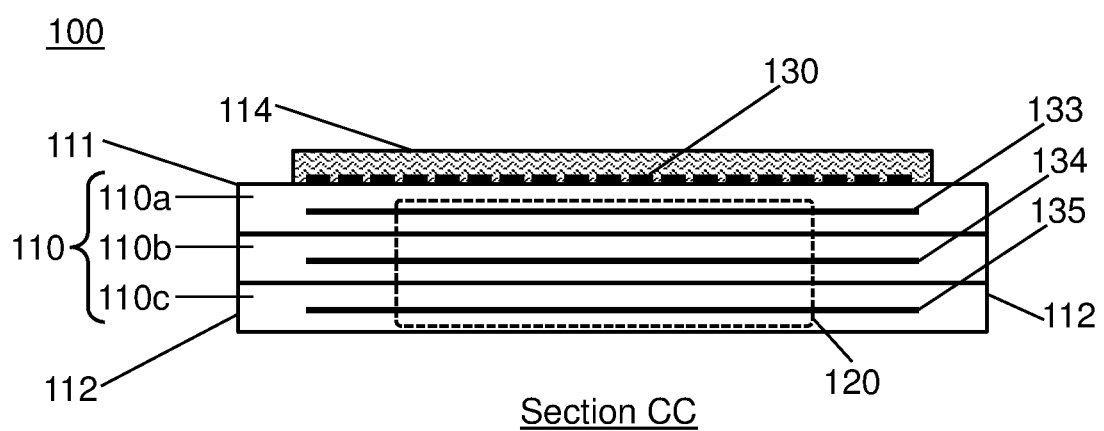

Reference is now made to FIGS. 3A and 3B, which are schematic illustrations of device 100 including wires 133, 134, 135 placed in different layers 110a, 110b, 110c of support structure 110 of device 100, according to some embodiments of the invention. FIG. 3A shows a schematic top view of device 100. FIG. 3B shows a schematic section view of device 100 along line CC of FIG. 3A.

Support structure 110 of device 100 may include two or more layers, for example layers 110a, 110b, 100c schematically shown in FIG. 3B. Device 100 may include two or more wires, for example a wire 133, a wire 134 and a wire 135, each placed in one or more of the layers of support structure 110, e.g., in regions between integrated circuit 120 and outer surfaces 112 of support structure 110, as schematically shown in FIG. 3B. Each of wires 133, 134, 135 may be connected to processing circuitry 140. Processing circuitry 140 may determine, based on signals from wires 133, 134, 135, a location at which support structure 110 is damaged (e.g., as described above with respect to FIGS. 1A-1F). For example, if no signal from wire 133 is received, it may be determined that wire 133 and layer 110a of support structure 110 accommodating wire 133 are damaged.

While three layers 110a, 110b, 110c and three wires 133, 134, 135 are shown, support structure 110 may include a plurality of layers and device 100 may include a plurality of wires, wherein each of the wires may be placed in one or more of the plurality of layers. For example, a single wire may be placed in two layers of supporting structure 110. In another example, a single layer may include two or more wires each placed, for example, along a different portion of the perimeter of support structure 110 (e.g., as described above with respect to FIG. 2).

Figure 4:
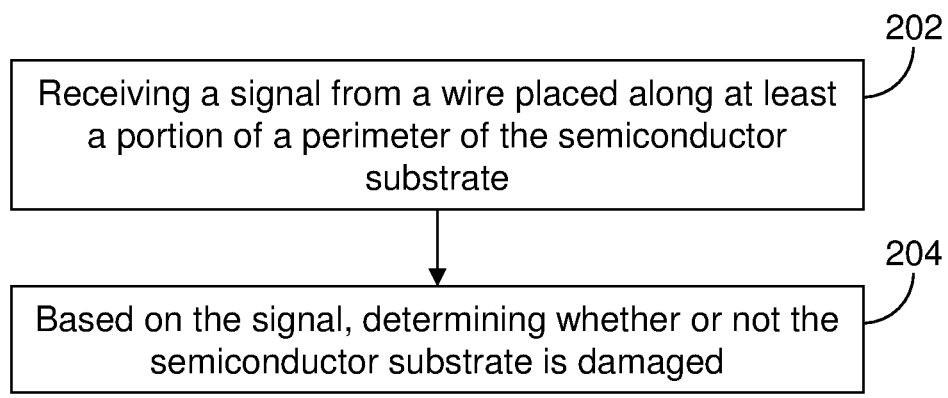
FIG. 4 is a flowchart of a method of determining damage in a semiconductor substrate, according to some embodiments of the invention.

Reference is now made to FIG. 4, which is a flowchart of a method of determining damage in a semiconductor substrate, according to some embodiments of the invention.

In operation 202, a signal from a wire placed along at least a portion of a perimeter of a semiconductor substrate may be received. For example, the semiconductor substrate and the wire may be similar to support structure 110 and wire 130, respectively, described above with respect to FIGS. 1A-1F. The signal may be generated by a circuit (e.g., processing circuitry 140) within the semiconductor placing a voltage on the wire at a first end of the wire; damage to the wire alters the voltage detected at a second end of the wire.

In operation 204, based on the signal, it may be determined whether or not the semiconductor substrate is damaged. For example, existence or absence of damage may be determined by processing circuitry 140 as described above with respect to FIGS. 1A-1F.

In some embodiments, the semiconductor substrate may include a plurality of wires each placed along a different portion of the perimeter of semiconductor substrate (e.g., as described above with respect to FIG. 2). In operation, based on the signals from the plurality of wires, a location at which the semiconductor substrate is damaged may be determined (e.g., as described above with respect to FIG. 2).

In some embodiments, the semiconductor substrate may include a plurality of layers and a plurality of wires, wherein each of the wires may be placed in one or more of the plurality of layers (e.g., as described above with respect to FIGS. 3A and 3B). In operation, based on the signals from the plurality of wires, a location at which the semiconductor substrate is damaged may be determined (e.g., as described above with respect to FIGS. 3A and 3B).

Embodiments of the invention may provide simple solution for determining existence or absence of damage in semiconductor substrates of semiconductor devices (e.g., bare semiconductor devices). Embodiments of the invention may reduce time and engineering efforts involved in failure analysis of damaged semiconductor devices.

In the above description, an embodiment is an example or implementation of the invention. The various appearances of "one embodiment", "an embodiment", "certain embodiments" or "some embodiments" do not necessarily all refer to the same embodiments. Although various features of the invention can be described in the context of a single embodiment, the features can also be provided separately or in any suitable combination. Conversely, although the invention can be described herein in the context of separate embodiments for clarity, the invention can also be implemented in a single embodiment. Certain embodiments of the invention can include features from different embodiments disclosed above, and certain embodiments can incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A semiconductor device comprising:
   a semiconductor substrate;
   a single wire placed only on a top surface of the semiconductor substrate along at least a portion of a perimeter of the semiconductor substrate, the single wire running along the at least a portion of the perimeter in a single conductive path; and
   processing circuitry connected to the single wire, the processing circuitry to, based on a signal from the single wire, determine whether or not the semiconductor device is damaged.

2. The semiconductor device of claim 1, comprising a seal ring placed along the perimeter of the semiconductor substrate, wherein the single wire is placed near the seal ring such that the seal ring surrounds the single wire.

3. The semiconductor device of claim 2, wherein the single wire is positioned at a distance of 1-100 micrometers from the seal ring.

4. The semiconductor device of claim 1, wherein the processing circuitry is further configured to generate an input signal and to compare the input signal to the signal from the single wire to determine whether or not the semiconductor device is damaged.

5. The semiconductor device of claim 4, wherein the signal from the single wire comprises a voltage change detected from a first end of the single wire to a second end of the single wire.

6. The semiconductor device of claim 1, wherein the processing circuitry is further configured, based on the signal from the single wire, to determine a location at which the semiconductor device is damaged.

7. A device comprising:
   a support structure comprising an integrated circuit,
   a single wire placed only on a top surface of the support structure along at least a portion of a perimeter of the support structure, the single wire running around the support structure in a single conductive path; and
   a controller configured to receive a signal from the single wire and, based on the signal, to determine if the support structure is damaged.

8. The device of claim 7, comprising a seal ring placed along the perimeter of the support structure, wherein single wire is placed near the seal ring such that the seal ring surrounds the single wire.

9. The device of claim 8, wherein the single wire is positioned at a distance of 1-100 micrometers from the seal ring.

10. The device of claim 7, wherein the controller is further configured to determine damage to the support structure, based upon the signal from the single wire, during an assembly process of the device.

11. The device of claim 7, wherein the controller is further configured to generate an input signal and to compare the input signal to the signal from the single wire to determine whether or not the support structure is damaged.

12. The device of claim 11, wherein the signal received from the single wire comprises a voltage change detected from a first end of the single wire to a second end of the single wire.

13. The device of claim 7, wherein the controller is further configured, based on the signal from the single wire, to determine a location at which the support structure is damaged.

14. A method of determining damage in a semiconductor substrate, the method comprising:
    receiving a signal from a single wire placed only on a top surface of the semiconductor substrate along at least a portion of a perimeter of the semiconductor substrate, the single wire running along the at least a portion of the perimeter in a single conductive path; and
    based on the signal, determining whether or not the semiconductor substrate is damaged.

15. The method of claim 14, wherein receiving the signal comprises detecting a voltage change from a first end of the single wire to a second end of the single wire.

16. The method of claim 15, further comprising generating an input signal, and comparing the input signal to the signal from the single wire, such that determining whether or not the semiconductor substrate is damaged is based on the comparison of the input signal to the signal from the single wire.

17. The method of claim 16, wherein comparing comprises determining if there is a voltage change from a first end of the single wire to a second end of the single wire.

* * * * *